United States Patent [19]

Cronauer et al.

[11] Patent Number: 4,893,093

[45] Date of Patent: Jan. 9, 1990

[54] SWITCHED POWER SPLITTER

[75] Inventors: Edward A. Cronauer, Massapequa Park; Eileen T. Sarc, Bohemia, both of N.Y.

[73] Assignee: United Technologies Incorporated, Hartford, Conn.

[21] Appl. No.: 305,960

[22] Filed: Feb. 2, 1989

[51] Int. Cl.[4] .............................................. H03F 3/68
[52] U.S. Cl. .................................... 330/295; 330/286
[58] Field of Search .......... 330/53, 57, 124 D, 124 R, 330/286, 295; 333/100, 101, 105

[56] References Cited

U.S. PATENT DOCUMENTS

| | | | |
|---|---|---|---|
| 3,963,993 | 6/1976 | Hoffman et al. | 330/124 D X |
| 4,755,769 | 7/1988 | Katz | 330/295 |
| 4,780,685 | 10/1988 | Ferguson | 330/295 X |

*Primary Examiner*—Steven Mottola
*Attorney, Agent, or Firm*—Perman & Green

[57] ABSTRACT

An improved, switched, power splitter is described in which a high frequency input signal is applied via an input to a plurality of amplifiers. First transmission lines are connected between the input and each of the amplifiers, the impedance of each of the first transmission lines being alterable to either a high or low level. A balanced resistance network is preferably coupled between the first transmission lines. Second transmission lines are connected in shunt across the first transmission lines, the impedance of each second transmission line being alterable to an impedance which is a predetermined percentage of the circuits input impedance. A control circuit switches the various transmission lines so that the impedance at the input remains balanced, no matter how many of the first transmission lines are in the high impedance state.

8 Claims, 3 Drawing Sheets

SWITCHED POWER SPLITTER

FIELD OF THE INVENTION

This invention relates to high frequency signal transmission and, more particularly, to a means for controlling the output power of a high frequency signal transmitter.

BACKGROUND OF THE INVENTION

In controlling the output power level of a high frequency transmitter, it is often desirable to achieve discrete output power levels on a selectable basis. In achieving such selectability, it is necessary that the switching apparatus consume minimum power; that it provide phase-balanced power control at each selection level; and that it employ the minimum amount of circuitry to accomplish the selection function.

One power switching system which is capable of such selective control of output power is shown in FIG. 1. The input from a transmitter is applied via line 10 to a four-arm, switched, power splitting network. The input signal is applied through a conventional Wilkinson splitter which comprises four quarter-wavelength transmission lines 14, 16, 18 and 20, all of which are coupled together through isolation resistors 22, 24, 26 and 28. The Wilkinson circuit functions as an impedance matcher and four-way power splitter. The output from each arm of the Wilkinson splitter is applied to a switching circuit which controls the application of the input signal to a connected RF amplifier (i.e., RF amplifiers 50, 52, 54 and 56). The outputs from the aforementioned amplifiers feed through a Wilkinson combiner 58 to output line 60. One switching circuit 30 is shown in detail and switching circuits 32, 34, and 36 are identical.

Switching circuit 30 comprises two PIN diodes 40 and 42 which are connected via quarter-wavelength transmission lines 44 and 46 respectively, to input line 48 of switch circuit 30. Quarter-wavelength transmission line 44 has one end connected to a terminating resistor 62 whose value is equal to the input impedance of amplifier 50. PIN diode 40 shunts resistor 62 to ground when the diode is in its highly conductive state. As is well known, PIN diodes appear as an RF short circuit when an appropriate DC bias is applied. In FIG. 1 bias source V is connected to diode 40 via coil 64 and switch 66. It should be understood that the circuit for applying a DC bias to PIN diodes 40 and 42 are shown schematically and will generally incorporate semiconductor switching circuits for the appropriate switching function. A similar circuit controls the conduction state of PIN diode 42 via switch 68.

The conductivity states of switches 66 and 68 are controlled by power control circuit 70 (as are the equivalent switching functions in switches 32, 34 and 36). Through appropriate control of the switching states of each of switches 30, 32, 34 and 36, power control 70 can cause the output voltage appearing on lines 60 to vary in level over a number of discrete steps (e.g., 25%, 50%, 75%, 100%, etc.).

The operation of each switching circuit 30, 32, 34 and 36 occurs in the following manner. If it is assumed that power is to pass through switch 30 to amplifier 50, then switch 66 is closed while switch 68 is opened. This results in PIN diode 40 being conductive and PIN diode 42 non-conductive. The conduction of PIN diode 40 short-circuits to ground the lower end of quarter-wavelength line 44, causing it to appear as an infinite impedance at point 72. The non-conductive state of PIN diode 42 allows quarter-wavelength line 46 to appear transparent and to reflect back to its input, the input impedance of amplifier 50. The presence of switching circuit 30 and its series connected transmission line 46 can results in a nominal 0.5 db loss between input line 48 and amplifier 50.

When it is desired to prevent the input signal from arriving at amplifier 50, switch 66 is opened and switched 68 closed, thereby rendering PIN diodes 40 and 42 non-conductive and conductive respectively. Thus, transmission line 44 reflects the impedance of resistor 62 at point 72 and transmission line 46 appears as an infinite impedance. Thus, the input signal still sees the identical input impedance on input line 48 as it sees at the inputs to each of the other switches 32, 34, 36 but no signal reaches amplifier 50. In this manner, balanced feed of the input signal continues while the switching function occurs.

The essential problems with this network arise from the complex circuitry and added losses which result from series connected switches 30, 32, 34 and 36.

Accordingly, it is an object of this invention to provide a multi-path power splitter which provides minimal feed-through loss.

It is still another object of this invention to provide a switched, RF power splitter wherein the number of components are minimized.

SUMMARY OF THE INVENTION

An improved, level controlled, power splitter is described in which a high frequency input signal is applied via an input to a plurality of amplifiers. First transmission line means are connected between the input and each of the amplifiers, the impedance of each of the first transmission line means being alterable to either a high or low level. A balanced resistance isolating network is coupled between the first transmission line means. Second transmission line means are connected in shunt with the first transmission line means, the impedance of each second transmission line means being alterable to an impedance which is a predetermined percentage of the circuit's input impedance. A control circuit switches the various transmission line means so that the power flow is controlled and the impedance at the input remains matched, no matter how many of the first transmission line means are in the high impedance state.

An alternative power splitter is also disclosed which exhibits continuous variability in its output.

DESCRIPTION OF THE PREFERRED EMBODIMENT

Figure 1:
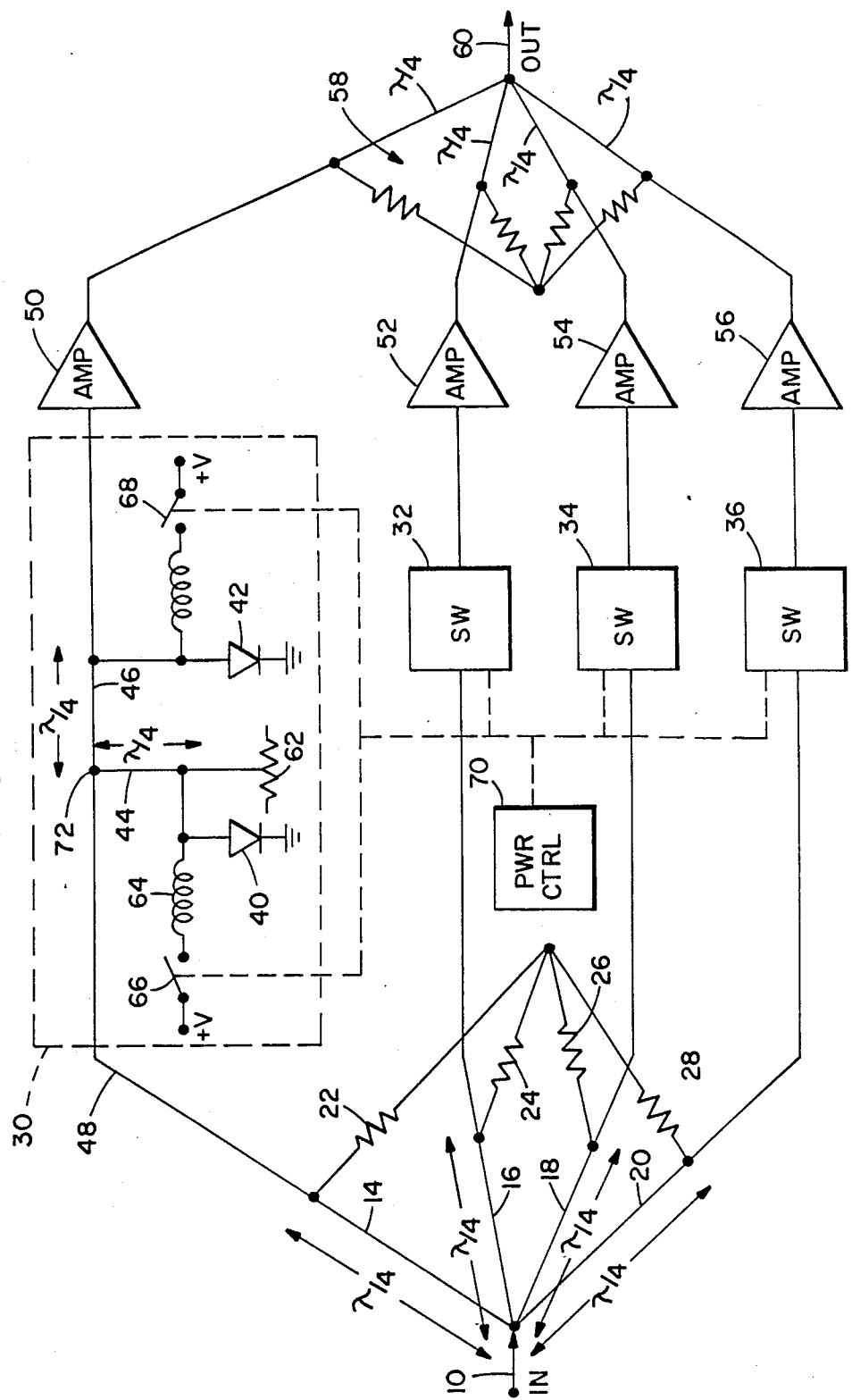
FIG. 1 is a circuit diagram of a less-than-optimum switched, power splitter.
Figure 2:
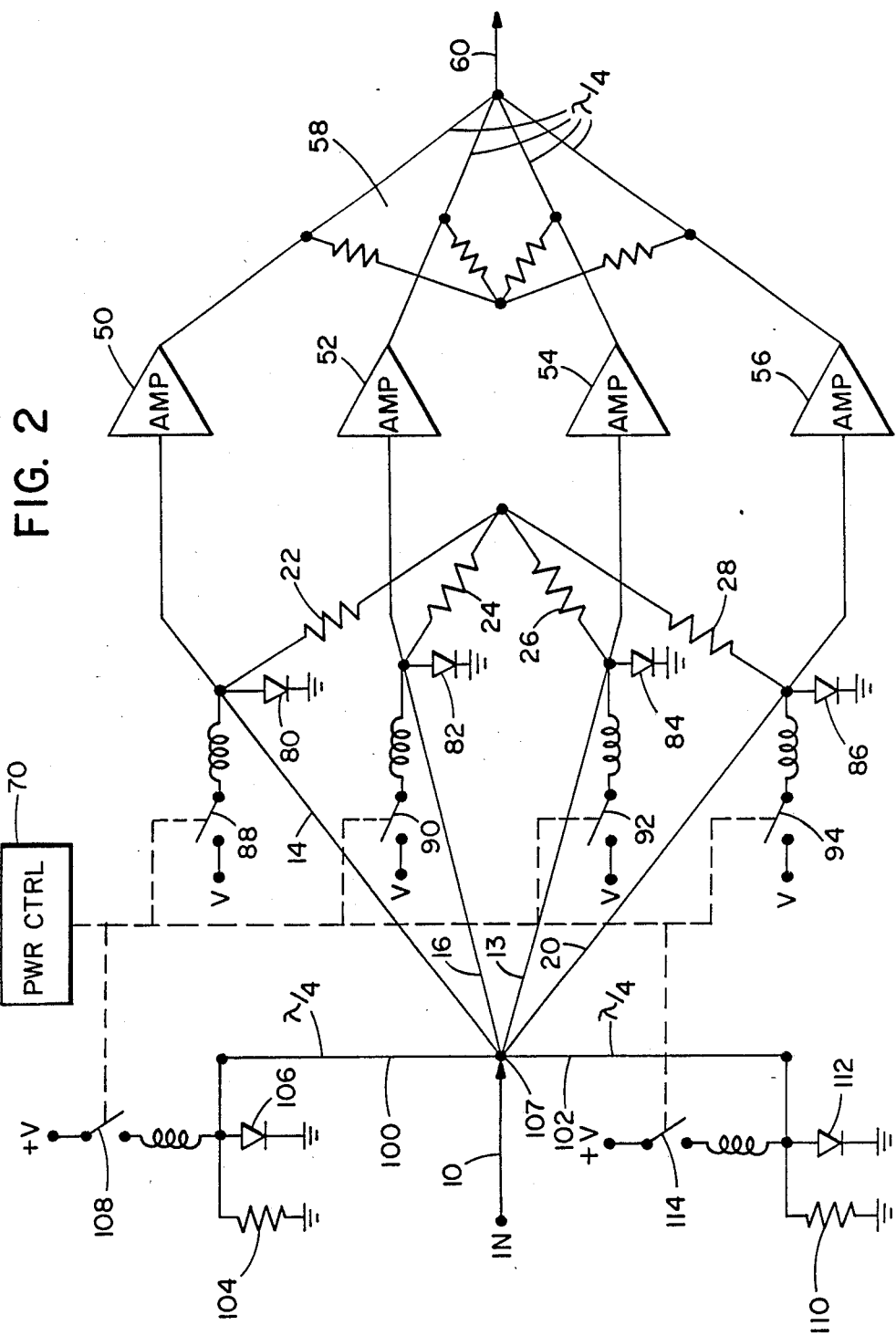
FIG. 2 is a circuit diagram of a switched power splitter in accordance with the invention.

Referring now to FIG. 2, each of the circuit components which is identical to that in the circuit of FIG. 1 has been numbered in a like manner. Each of input quarter-wavelength transmission lines 14, 16, 18 and 20 is now terminated by a shunt connected PIN diode 80, 2, 84 and 86 respectively. Each of the aforementioned diodes has its conductivity state controlled in the manner aforedescribed by a connected switch 88, 90, 92 and 94 respectively.

Impedance matching and thus power throughput, is partly provided by a plurality of quarter-wavelength transmission lines 100 and 102 connected in shunt across input line 10 at point 107. Transmission line 100 terminates in resistor 104 whose value is approximately equal to the input impedance of the circuit at point 107 when one of the RF amplifiers (e.g., amplifier 50) is removed from the circuit. Resistor 104 is shunted by PIN diode 106 whose conductivity state is controlled by switch 108. In a similar manner, transmission line 102 is terminated by resistor 110. The value of resistor 110 is approximately equal to the circuit input impedance as seen at point 107 when two RF amplifiers are disconnected from the circuit. Resistor 110 is shunted by PIN diode 112 whose conductivity state is controlled by switch 114.

A shunting transmission line and its accompanying switching control circuit is put into action only when it is desired to reduce the output power of the power splitter. Thus while two shunt matching circuits are shown, it is to be understood that additional shunt circuits may be added if it is desired to step-wise, reduce the power output through the elimination of more than three RF amplifier branches.

The operation of the circuit of FIG. 2 is as follows. Assuming that 100% output power is desired at output line 60, power control 70 closes switches 108 and 114, causing diodes 106 and 112 to be rendered highly conductive at the RF frequency. Thus, each of quarter-wavelength transmission lines 100 and 102 appear as high impedances at point 107 resulting in substantially 100% power feed-through. Additionally, switches 88, 90, 92 and 94 are all caused to be open by power control 70, so that diodes 80, 82, 84 and 86 remain non-conductive to RF currents. Thus, an input signal at point 107 sees transmission lines 14, 16, 18 and 20 exhibiting balanced and equal input impedances, and the input signal is fed, in equal proportions, to the respectively connected RF amplifiers 50, 52, 54 and 56. (Under these conditions, no currents flow in resistors 22, 24, 26 and 28). The outputs from the aforementioned amplifiers are fed through a Wilkinson combining circuit 58 to output conductor 60.

To obtain a reduction in output power, power control 70 opens switch 108 while allowing switch 114 to remain closed. Additionally, switch 88 is closed while switches 90, 92, and 94 remain open. The opening of switch 108, causes diode 106 to exhibit a high RF impedance thereby "insert", in shunt, transmission line 100 and terminating resistors 104 at point 107. The closure of switch 88 renders diode 80 heavily conductive thereby causing transmission line 14 to exhibit a substantially infinite impedance at point 107. If not for the presence of transmission line 100 and its terminating resistor 104, the increase in impedance of transmission line 14 would cause an imbalance in the circuit's input impedance. This would create undesirable reflections on input line 10 and the establishment of a voltage standing wave ratio (VSWR). While under certain operating conditions, a low level VSWR is acceptable, it is preferred to reduce the VSWR to or close to zero as possible (within reasonable cost/benefit limits). A VSWR under these conditions is avoided by the shunt insertion of transmission line 100 and its terminating resistor 104. The combined impedances of those circuit elements match the impedance seen at point 107 from the remaining circuitry. That impedance is a combination of the impedances of resistors 22, 24, 26 and 28 and RF amplifiers 52, 54 and 56. (There is now current flow into resistor 22, from resistors 24, 26 and 28 due to the conducting state of diode 80).

Thus, shunt-connected quarter-wavelength line 100 and resistor 104 cause the impedance balance to be reestablished, while at the same time the incoming power is equally distributed among transmission lines 16, 18 and 20, and the output power is reduced.

If an even lower power output is desired, switches 88 and 90 are closed by power control 70 while switches 92 and 94 remain open. Additionally, switch 108 is closed and 114 opened—thereby rendering diode 112 substantially non-conductive to RF currents. The impedance of resistor 110 in combination with transmission line 102 is sized to equal the input impedance as seen at point 107 when two RF amplifiers are disconnected from the circuit. Thus, transmission lines 14 and 16 appear substantially as open circuits to input line 10 and transmission line 102 exhibits an impedance which is equivalent to the input impedance of the two "open" transmission lines 18 and 20. 50% of the input power is thereby dissipated in the shunting circuit whereas 25% of power passes through each of transmission lines 18 and 20 to their respectively connected amplifiers 54 and 56, etc.

Figure 3:
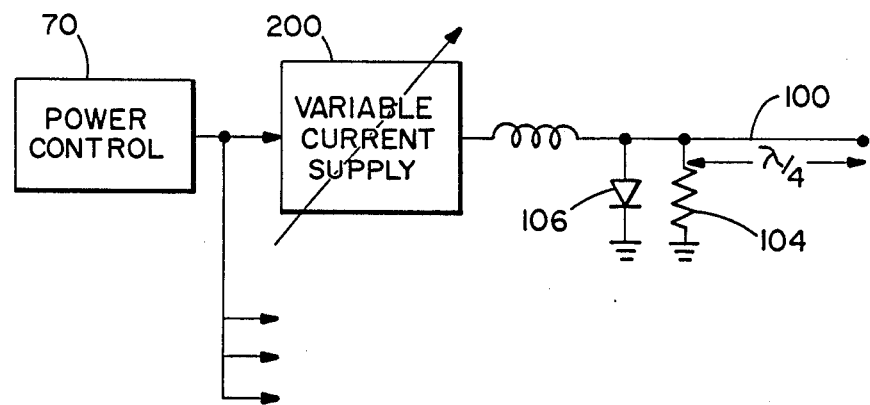
FIG. 3 is a circuit diagram of a continuously variable switch which, when substituted for the stepped switches in FIG. 2, allows continuously variable output.

Referring now to FIG. 3, a switching circuit is shown which enables continuous impedance matching, as switched power feed-through occurs. In lieu of each shunt connector switching circuit including an on/off switch, a continuously variable current supply 200 has been substituted. In all other respects the switching circuit is identical to those shown in FIG. 2. By varying the DC current through PIN diode 106, the parallel impedance of diode 106 and resistor 104 can change the effective terminating impedance of transmission line 100 over a substantial range. This allows for a single shunt circuit to provide the desired impedance matching when one, two or more arms of the power splitting circuit are removed.

It can be seen from the above that the transmission lines required for the Wilkinson power splitter are enabled, by these constructions, to enable the switching or control of power to the output line under continuous impedance matched conditions while, at the same time, assuring balanced power distribution. Thus, not only is the series 0.5 db loss transmission line eliminated (see FIG. 1), but also the switching network eliminates PIN diodes and quarter wave transmission lines along with their associated control electronics.

It is to be understood that the above described embodiments of the invention are illustrative only and that modifications throughout may occur to those skilled in the art. Accordingly, this invention is not to be regarded as limited to the embodiments disclosed herein, but is to be limited as defined by the appended claims.

I claim:
1. A switched power splitter comprising:
input means for providing high frequency input signals;
a plurality of amplifier means;
first transmission line means connected between said input means and each said amplifier means, each said first transmission line means exhibiting an impedance which may be altered to either a high or low level state;

resistance means coupled between each said first transmission line means, said resistance means being balanced and having no substantial current flow therethrough when all said first transmission line means are in their low level impedance state and being unbalanced and having a current flow therethrough when one or more of said first transmission line means is in its high impedance state and another of said first transmission line means is in its low impedance state;

second transmission line means connected in shunt across said first transmission line means, the impedance of said second transmission line means being alterable to either a low or high level state;

a control means connected to said first and second transmission line means for selectively altering the impedance state of said first transmission line means and for simultaneously altering the impedance state of said second transmission line means in the opposite manner.

2. The invention as defined in claim 1 wherein said second transmission line means comprises:

plurality of quarter wave transmission lines, each said transmission line means having a terminating impedance; and switch means for selectively causing each said second transmission line means to exhibit, at said input means, a substantially infinite impedance or an impedance substantially equal to the combined impedance of said terminating impedance and an associated transmission line means.

3. The invention as defined in claim 2 wherein said terminating impedances are of a different size so that said second transmission line means exhibits an input impedance at said input means which is equivalent to a predetermined percentage of the collective input impedance of said first transmission line means which exhibit said low level impedance.

4. The invention as defined in claim 3 wherein each said first transmission line means comprises:

a quarter-wavelength transmission line connected between said input means and an amplifier means; and input switch means associated with each said quarter-wavelength transmission line for altering the impedance state thereof between high and low impedance states.

5. The invention as defined in claim 4 wherein each said switching means comprises diode means and control voltage means for switching said diode means between a high RF impedance state and a low RF impedance state.

6. A switched power splitter comprising:
a plurality of high frequency amplifiers;
an input point for receiving a high frequency signal;
a quarter wave transmission line for each said amplifier, one end of which is connected to said input point and a second end of which is connected to said amplifier;
balanced resistance means, connecting the second end of each said transmission line to a common point;
diode switch means connected to each said second end of each said transmission line for controllably shorting each said second end to a common potential when in a high frequency conductive state or exhibiting an open circuit thereto when in a high frequency non-conductive state; and
control means for rendering one or more of said diode switch means to the high frequency conduction state while others are in the high frequency non-conduction state.

7. The invention as defined in claim 6 further comprising:
additional quarter wave transmission line means connected to said input point, each said additional transmission line means terminated by a parallel connected diode means and resistor circuit, each said diode means connected to said control means, whereby said control means renders at least one said diode means into its high frequency non-conductive state when it renders a diode switch means into its high frequency conduction state.

8. A power splitter comprising:
a plurality of high frequency amplifiers;
an input point for receiving a high frequency signal;
a quarter wave transmission line for each said amplifier, one end of which is connected to said input point and a second end of which is connected to said amplifier;
balanced resistance means, connecting the second end of each said transmission line to a common point;
diode switch means connected to each said second end of each said transmission line for controllably shorting each said second end to a common potential when in a high frequency conductive state or exhibiting an open circuit thereto when in a high frequency non-conductive state; and
control means for rendering one or more of said diode switch means to the high frequency conduction state while others are in the high frequency non-conduction state.
an additional quarter wave transmission line connected to said input point, said additional transmission line terminated by a diode means and resistor circuit, said diode means connected to said control means, and said control means include variable current means to alter continuously the impedance of said circuit, whereby the impedance of said additional transmission line is alterable in accordance with the operation of said diode switch means.

* * * * *